(12) United States Patent
Thompson et al.

(10) Patent No.: US 6,639,147 B2
(45) Date of Patent: Oct. 28, 2003

(54) CAPTIVE LOW-PROFILE EMI GROUNDING CLIP

(75) Inventors: Daniel T. Thompson, Houston, TX (US); Robert J. Hastings, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/325,399

(22) Filed: Dec. 20, 2002

(65) Prior Publication Data

US 2003/0121688 A1 Jul. 3, 2003

Related U.S. Application Data

(63) Continuation of application No. 10/028,841, filed on Dec. 20, 2001.

(51) Int. Cl.[7] .................................................. H05K 9/00
(52) U.S. Cl. .................................................. 174/35 GC
(58) Field of Search ........................ 174/35 GC, 35 R; 361/800, 816, 818; 277/920

(56) References Cited

U.S. PATENT DOCUMENTS

| | | | |
|---|---|---|---|
| 5,138,529 A | 8/1992 | Colton et al. | 361/816 |
| 5,218,760 A | 6/1993 | Colton et al. | 29/845 |
| 5,225,629 A | 7/1993 | Garrett | 174/35 R |
| 5,313,016 A | 5/1994 | Brusati et al. | 174/35 GC |
| 5,691,503 A | 11/1997 | Kato | 174/35 R |
| 5,932,954 A | 8/1999 | Kwon | 313/313 |
| 6,043,991 A * | 3/2000 | Sorrentino | 361/816 |
| 6,143,979 A * | 11/2000 | Millard | 174/35 GC |
| 6,291,766 B1 * | 9/2001 | Komai | 174/35 R |
| 6,483,023 B1 * | 11/2002 | Jacques | 174/35 GC |

OTHER PUBLICATIONS

Instrument Specialties Catalog, "Engineering Design and Shielding Product Selection Guide," p. 62, 64, Apr. 1998.

* cited by examiner

*Primary Examiner*—Hung V. Ngo (57) ABSTRACT

An EMI clip retaining system including a flexible EMI clip with a center contact portion that bows upwards and inwards from acute bends situated at the outer ends of the EMI clip and also including enlarged end portions that extend flatly inwards from the acute bends. The EMI clip is captively installable in a planar mounting surface with tapered mounting holes through which the enlarged end portions of the EMI clip are inserted, such that once the EMI clip is installed, the enlarged ends of the EMI clip reside on a bottom side of the mounting surface while the center contact portion bows upward from the opposite, top side of the mounting surface. When the center portion is compressed flat against the top side of the mounting surface, the EMI clip lies flat against both the top and bottom sides of the mounting surface.

26 Claims, 5 Drawing Sheets

CAPTIVE LOW-PROFILE EMI GROUNDING CLIP

CROSS-REFERENCE TO RELATED APPLICATIONS

This application is a continuation of U.S. application Ser. No. 10/028,841, filed Dec. 20, 2001, which is incorporated by reference herein.

STATEMENT REGARDING FEDERALLY SPONSORED RESEARCH OR DEVELOPMENT

Not applicable.

BACKGROUND OF THE INVENTION

Field of the Invention

The present invention generally relates to electromagnetic or EMI shielding. More specifically, the invention relates to an EMI grounding clip for maintaining a grounding path between separable portions of electronic device enclosures.

Background of the Invention

In the field of electronics, radio frequency (RF) and electromagnetic interference (EMI) are important factors to consider in product designs. On the one hand, EMI waves from external sources have the potential to affect the operation of components inside an electronics package. On the other hand, the FCC and other regulatory agencies impose limits on the frequency and levels of EMI signals that may emanate outwards from the inside of an electronics product. One way to control EMI problems is to package electronics products in an appropriately shielded enclosure. A conventional technique for providing such shielding is to surround internal components with a continuously grounded enclosure. Unfortunately, assembly and service constraints prohibit housing products in a one piece enclosure. Consequently, electronics housings are usually comprised of separate pieces that are fastened together to create a uniform enclosure.

To prevent the EMI problems discussed above, the various pieces of an electronics enclosure must be electrically conductive and coupled to one other. By coupling all pieces of the cover to one another, the entire enclosure can be effectively coupled to ground to form an EMI barrier around the electrical components. Under normal circumstances, simply fastening the pieces of a cover together is not sufficient to ensure electrical conductivity over the anticipated range of operating temperatures and conditions. Internal and external temperature variations may cause some portions of the enclosure to expand or contract at different rates, thereby producing gaps or increasing electrical resistance between pieces of an enclosure. To eliminate this problem, conductive gaskets, clips, or springs may be placed between pieces of an enclosure to maintain electrical conductivity between the pieces. EMI gaskets, clips, or springs are typically compressible and are designed to deflect with enough spring force to always maintain contact with the conductive surfaces of mating pieces of an enclosure.

The use of these conductive EMI devices is well known to those skilled in the art. Representative examples of conventional EMI clips are illustrated and described in U.S. Pat. Nos. 4,554,400 and 4,640,979, both to Schmalz. These EMI clips provide the necessary grounding to ensure RF shielding of electronic devices and, as with many conventional EMI clips, are installed by inserting a portion or portions of the clip into holes in the mounting surface. Conventional EMI clips such as these are therefore retained with tabs that are bent around a mounting hole or with an interference fit between the clip and the mounting hole. There are no other retaining means on these conventional clips. Thus, with these mounting configurations, a common problem is that the clips may become detached and fall out of their mounting locations. This problem is exacerbated by the fact that many conventional EMI clips are low compression clips that are very flexible and very easily deflected. Such characteristics are desirable to permit easier installation of enclosure panels, but also make it much easier for the clips to be pulled out of their mounting locations. Loose EMI clips are naturally a problem in electronics devices because of the potential damage they may cause by electrically coupling and shorting components and electrical traces inside the unit.

To combat this problem, other conventional retaining methods have been used, such as the use of adhesive-backed EMI clips to secure the clips in place. This solution is effective as long as the adhesive retains its bonding power. It is widely recognized, however, that adhesives have the propensity to deteriorate over time and therefore do not provide an effective long-term solution. Another solution has been to combine a series of EMI clips into a single chain of grounding fingers as shown in U.S. Pat. No. 5,917,147 to Lewis. This retaining method presumes that it is more difficult to displace or loosen a large array of grounding clips than smaller, individual clips. While this presumption is not without merit, the large array also requires that there is enough mounting space available to install the chain of grounding fingers. However, given the wide assortment of mounting and spacing configurations in electronics enclosures, it may be desirable to use individual grounding clips instead of such a large array.

Figure 1:
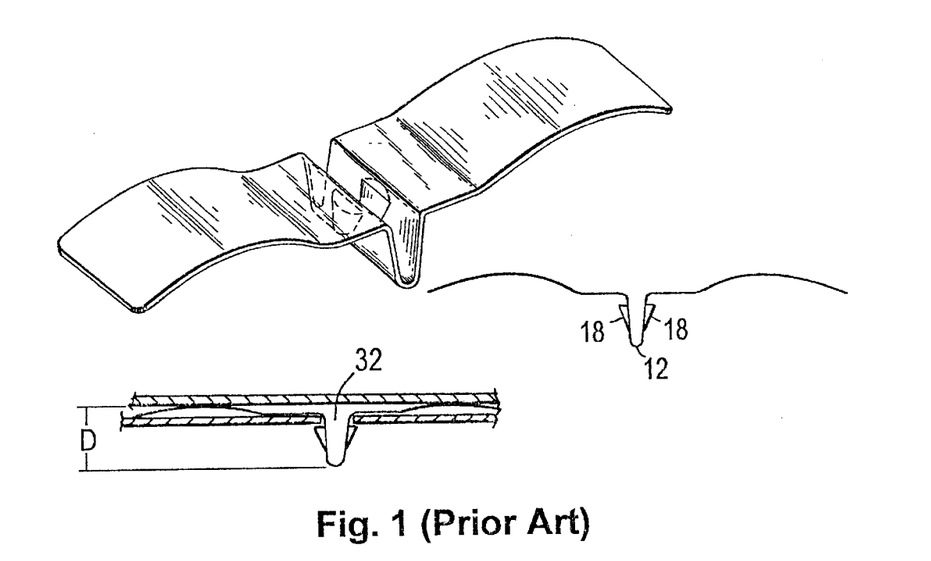
FIG. 1 shows a first prior art EMI clip with a captive mounting scheme.

Other improved methods of retaining EMI clips are described in U.S. Pat. Nos. 4,803,306 to Malmquist and 5,532,428 to Radloff et al, each of which provide more robust retaining schemes than the methods heretofore described. Images from the former of these two patents (Malnquist) are reproduced in FIG. 1, while images of the latter (Radloff) are reproduced in FIG. 2. The Malmquist clip comprises a U-shaped attaching portion 12 with a retaining notch 18 formed on each side of the U-shaped portion 12. These retaining notches 18 are configured to keep the EMI clip securely in place once the U-shaped portion 12 is inserted into a properly shaped mounting hole 32 in a retaining panel. One distinct disadvantage to this EMI clip is the depth D occupied on the insertion side of the EMI clip. The retaining notches 18 on the U-shaped portion 12 increase the volume requirements for this particular solution. Consequently, additional clearance must be designed into the electronics enclosure so as to prevent interference with the EMI clip.

Figure 2:
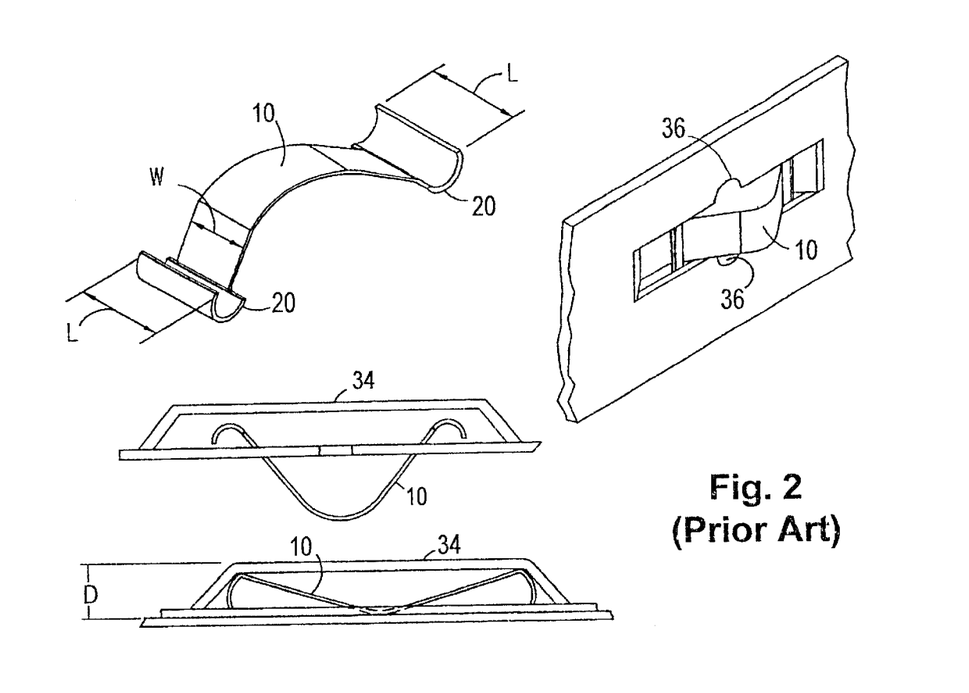
FIG. 2 shows a second prior art EMI clip with a captive mounting scheme.

By way of comparison, the retaining scheme used by Radloff shown in FIG. 2 also occupies additional space on the backside of the mounting surface. In this particular solution, the EMI clip 10 comprises end portions 20 that are substantially wider (dimension L) than the center portion (dimension W) of the clip. The EMI clip is installed into a mounting surface by inserting the end portions 20 through a slot 36 in the mounting surface one end portion at a time. The enlarged end portions 20 are captively held in place by a lance structure 34 that forms a cavity on the backside of the mounting surface in which the end portions 20 reside. When a mating cover is attached to the mounting surface, the EMI clip is compressed such that most of the clip is deflected into the volume between the lance structure 34 and the mounting surface. Unfortunately, this design, as with the Malmquist design, occupies a large volume of space behind the mounting surface (as denoted by dimension D).

Despite the effectiveness of these prior art captivation techniques, each occupies a large volume of space behind the mounting surface. Given the compact nature of electronics packaging, it is desirable, therefore, to provide a robust, low-profile means of captively retaining an EMI clip onto a mounting surface. The novel technique would advantageously decrease the amount of space required to hold the EMI clip in place, thereby permitting lower profile electronics enclosures.

SUMMARY OF THE INVENTION

The problems noted above are solved in large part by a novel, low-profile, captive retaining scheme for an EMI clip. The EMI clip is preferably an EMI shielding device comprised of an electrically conductive material and further comprising an elastically deformable body portion capable of applying a contact force between a top compressing surface and a planar bottom mounting surface. The EMI clip includes more than one enlarged, planar end portions that may each be installed in separate apertures in the mounting surface to captively retain the EMI shielding device on the mounting surface. When an installed EMI shielding device is compressed between the compressing and mounting surfaces, the deformable body portion of the EMI shielding device lies flat between the compressing and mounting surfaces. The enlarged end portions lie substantially flat on the side of the mounting surface opposite the side facing the compressing surface.

The EMI shielding device includes a narrow, center, contact portion that bows upwards and inwards from acute bends at the outer ends of the clip. At the top of the contact portion is an obtuse bend configured to bend elastically from some static angle larger than 90 degrees to an angle of 180. The clip also includes flat planar surfaces that ramp upwards from the acute bends towards the common obtuse bend. The enlarged end portions extend flatly inward from the side of the acute bend opposite the planar surfaces. The preferred embodiment of the EMI clip comprises two enlarged, planar end portions. The acute bends on the EMI clip are also elastically deformable to permit compression of the EMI shielding device between the mounting and compressing surfaces and also to permit extension of the EMI shielding device during installation of the EMI shielding device onto the mounting surface.

The preferred EMI clip works in conjunction with a tapered mounting hole pattern in the mounting surface to create an EMI clip retaining system. The planar mounting surface comprises mounting holes through which the enlarged end portions of the EMI clip are inserted such that the narrow center portion of the EMI clip resides on a top side of the mounting surface and the enlarged end portions of the EMI clip reside on the opposite, bottom side of the mounting surface. Once the EMI clip is inserted onto the mounting surface, the EMI clip is captively retained by the tapered shape of the mounting holes and also by the elastic forces within the EMI clip. The mounting surface holes comprise an aperture corresponding to each enlarged end of the EMI clip. The aperture shapes are preferably mirrored about an axis centered between the apertures. Each aperture in the mounting hole pattern comprises a narrow inner width that is wider than the width of the narrow center portion of the EMI clip but narrower than the width of the enlarged end portions of the EMI clip. The aperture also includes a wider outer width that is wider than the width of the enlarged end portions of the EMI clip. The sides of the aperture are tapered and transition from the narrow inner width to the wider outer width.

When the EMI clip is installed onto the mounting surface, the EMI clip is elastically stretched to insert the enlarged ends of the EMI clip through the wider outer width of the corresponding mounting hole apertures. Once inserted, the enlarged portions of the EMI clip contract to a position under the narrow inner width of the corresponding mounting hole apertures thereby captively retaining the EMI clip. The mounting hole apertures are positioned so that the narrow inner widths of the apertures are approximately the same distance apart as are the insides of the acute bends in the EMI clip. By the same token, the wider outer widths of the apertures are not so far apart as to induce plastic deformation of the EMI clip as it is stretched during installation. Alternatively, the mounting hole apertures may be positioned so that the narrow inner widths of the apertures are a larger distance apart than the insides of the acute bends in the EMI clip so as to create an interference contact between the EMI clip and the mounting surface. The preferred mounting surface thickness is approximately twice the thickness of the radii of the acute bends in the EMI clip.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . .". In addition, the phrase EMI is intended to refer to electromagnetic interference and is also intended to be fully synonymous with other similarly used terms of art, including, but not limited to, radio frequency (RF) interference or radio interference. Furthermore, the preferred EMI clip is intended to be used for creating an electrically conductive contact element between mating surfaces of an electronics enclosure so as to provide EMI shielding or grounding.

DETAILED DESCRIPTION OF THE PREFERRED EMBODIMENTS

Figure 3:
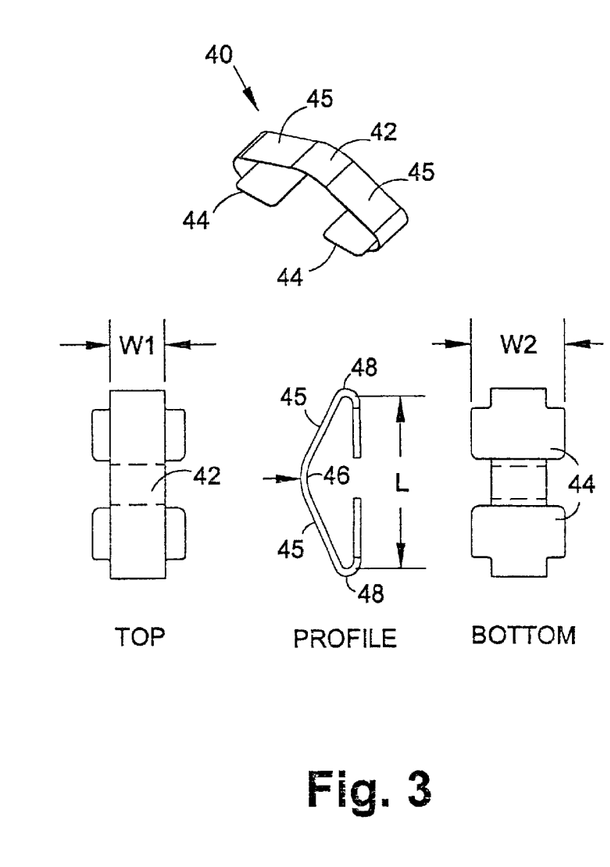
FIG. 3 shows isometric, top, profile, and bottom views of a preferred EMI clip.

Referring now to FIG. 3, the preferred embodiment of an EMI clip 40 comprises a thin conductive strip of material bent into the configuration shown. The preferred clip material is copper alloy, but other conductive materials may be used, including silver alloys and perhaps even composite materials impregnated with conductive material. The EMI clip preferably comprises at least two different cross section widths denoted by W1 and W2. The innermost portion 42 of the EMI clip has a width of W1 whereas the two outermost portions 44 have a width of W2. As FIG. 3 shows, W2 is larger than W1 and thus, the outermost portions 44 of the EMI clip 40 are wider than the innermost portion 42 of the clip.

As shown in the front profile view of FIG. 3, the clip 40 is preferably a uniform thickness across the entire length of the clip. Manufacturing considerations are one reason for this constraint since the clips may be economically stamped from sheets of raw stock. After stamping the preferred pattern from raw sheets of material, the blanks may be bent and heat treated to the proper dimensions and flexibility. However, there may be advantages to using EMI clips with varying cross sections. For example, it may be desirable for the EMI clip to deflect more easily at some bends rather than others. Thus, the thickness at a bend may be increased to reduce flexibility or the thickness may be decreased to promote flexibility. Naturally, elasticity of the material as well as fatigue strength of the material may determine the appropriate clip thickness. Those skilled in the art will recognize the advantages and disadvantages to manufacturing EMI clips with cross sections having varying thicknesses.

Figure 8:
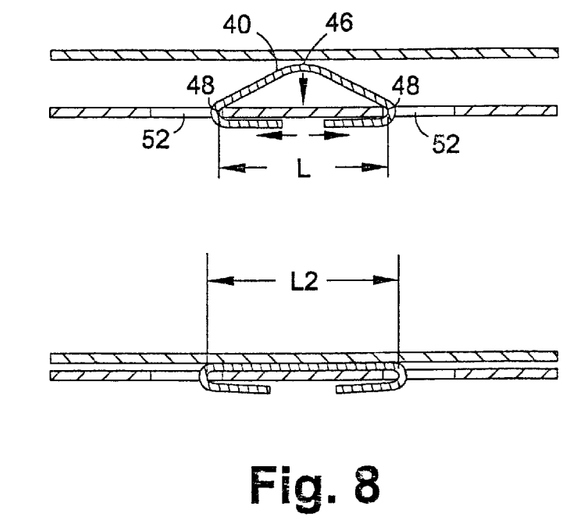
FIG. 8 shows section views of an assembled EMI clip in compressed and uncompressed contact with a mating cover.

The shape of the preferred EMI clip is characterized by an inner portion 42 that bows upward from enlarged end portions 44. The inner portion comprises an obtuse bend 46 at the top of the EMI clip and acute bends 48 at the lower, outer ends of the clip. The planar surfaces 45 between the obtuse and acute bends ramp upwards from the acute bends 48 to the commonly adjoined obtuse bend 46. The enlarged ends 44 of the clip 10 extend inward from the acute bends 48. The obtuse bend 46 at the top of the EMI clip is preferably configured to deflect elastically to approximately 180 degrees under a compressive force applied to the top of the clip. Upon removal of this compressive force, the bend 46 preferably returns to the static, ramped position shown. The elasticity of this bend preferably provides the requisite contact force between the surface to which the EMI clip is attached and a mating surface that applies the compressive force. Section views of an assembled EMI clip 40 in the compressed and uncompressed states are shown in FIG. 8. The acute bends 48 shown at opposite ends of the clip 40 are also preferably configured to deflect elastically, thereby permitting the clip 40 to lie substantially flat when compressed between two mating surfaces of an electronics enclosure.

The profile view in FIG. 3 also shows an installation dimension L, which is critical to the design of the mounting holes in which the preferred EMI clip 40 is installed. This dimension and its relationship to the preferred mounting hole configuration are discussed in further detail below.

Figure 4:
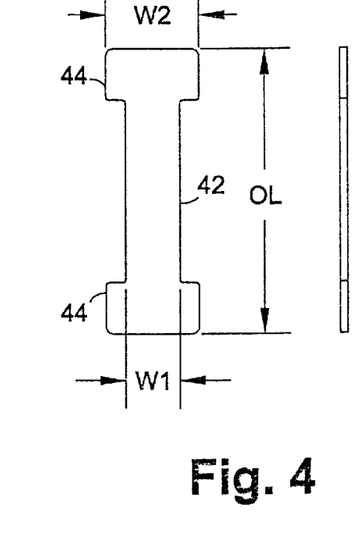
FIG. 4 shows top and profile views of a flat, unbent representation of the preferred EMI clip.
Figure 5:
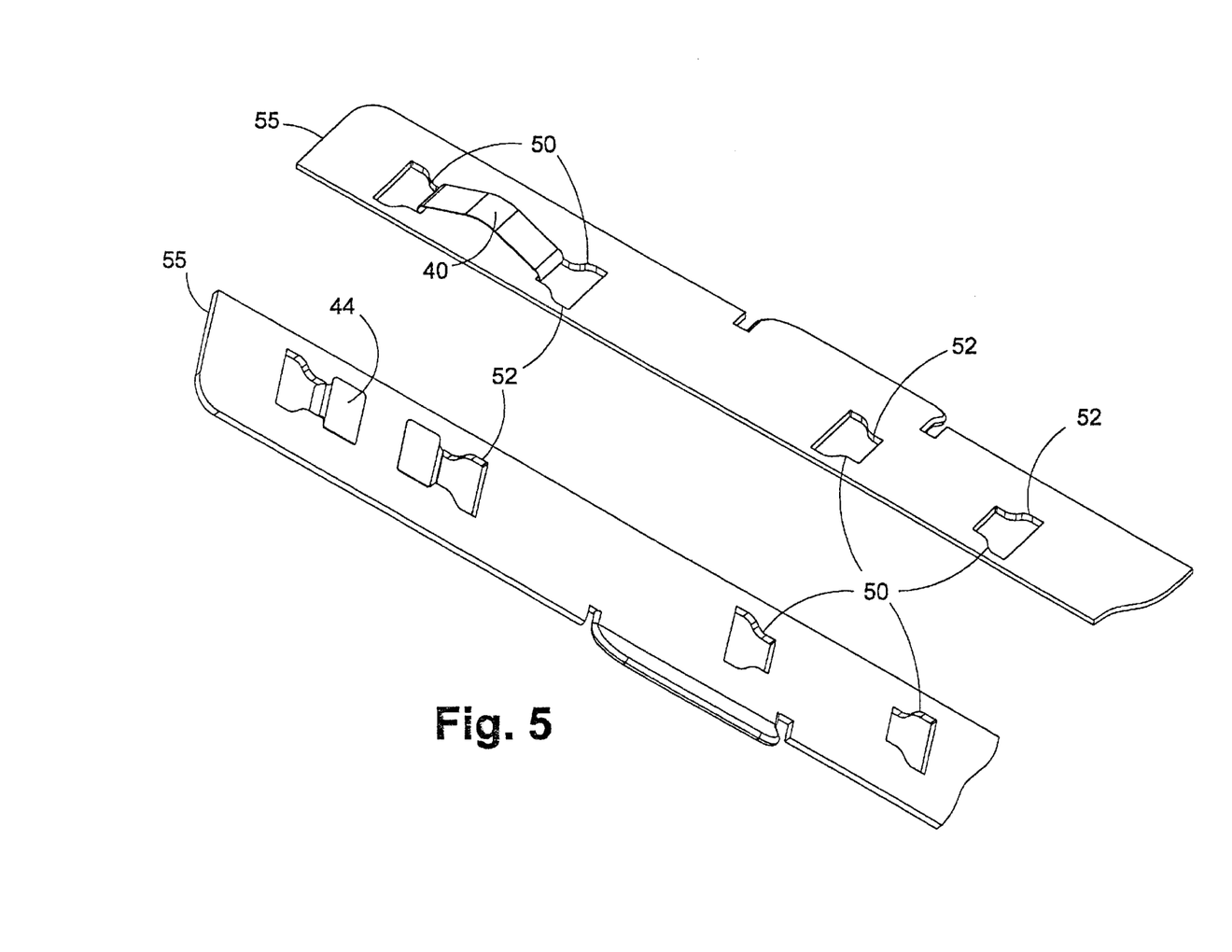
FIG. 5 shows isometric views of a preferred mounting configuration for the EMI clip.
Figure 6:
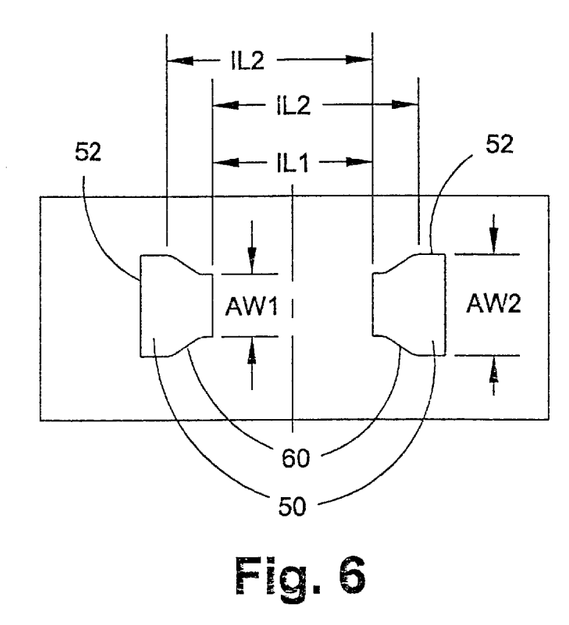
FIG. 6 shows a preferred mounting hole pattern for the preferred EMI clip.
Figure 7:
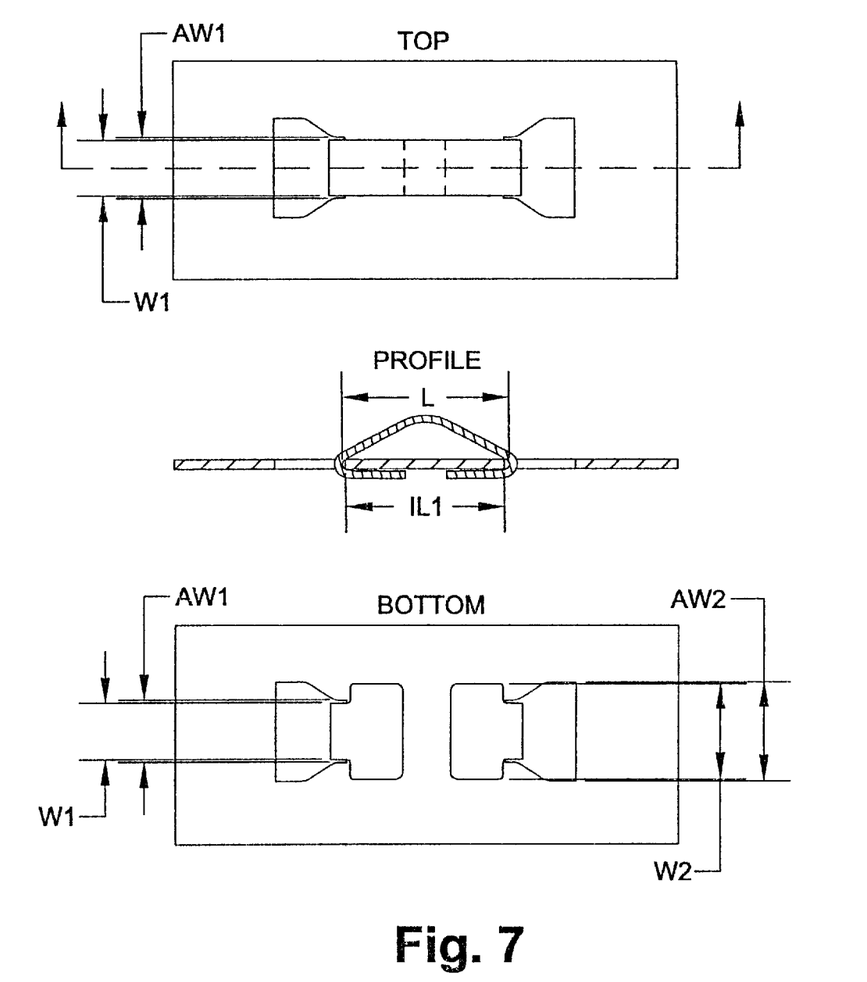
FIG. 7 shows top, profile, and bottom views of the preferred EMI clip mounted in the preferred mounting configuration.

Referring now to FIG. 4, a flattened representation of preferred EMI clip 40 is shown to aid in conceptualizing the shape of the clip. If the bends 46, 48 in the preferred EMI clip 40 are straightened out and the clip is laid flat, the representations shown in FIG. 4 will result. From these views, it is easy to identify the widened end portions 44 and their relation to the narrower central portion 42. The overall length OL of the preferred EMI clip may be varied according to space and design constraints, but the length of the clip will necessarily define the mounting hole configuration, which is shown in FIGS. 5–7. As mentioned above, this flattened representation may be used as a template for stamping or machining individual clips as a preliminary process in manufacturing the final product.

Referring now to FIG. 5, isometric perspective views of a representative mounting flange 55 comprising two sets of mounting holes 50 for the preferred EMI clip 40 are shown. The upper view represents a view of the top of the mounting flange 55 and one EMI clip 40 installed in one of the two mounting hole sets 50 on the mounting flange 55. The lower view represents the same mounting flange 55 and EMI clip 40 viewed from underneath the mounting flange 55. In accordance with the preferred embodiment, a mounting hole set 50 for one EMI clip 40 comprises two separate apertures 52 through which the enlarged ends 44 of the clip 40 are inserted. Each of the apertures 52 in each mounting hole set are preferably identical in shape, but mirrored about a centerline between the two apertures.

The preferred shape for the apertures 52 in a mounting hole set 50 are more clearly shown in FIG. 6. Four critical dimensions are qualitatively shown: AW1, AW2, IL1, and IL2. Dimensions AW1 and AW2 define the inner and outer aperture widths for both apertures 52. The sides 60 of each aperture 52 are predominantly tapered and preferably follow a contoured spline that transitions between the inner and outer aperture widths AW1 and AW2. The portions of the apertures that are closest to one another are preferably narrower than the portions that are the farthest from one another. Dimensions IL1 and IL2 are installation lengths and define the distance between respective features of the apertures 52 in a single mounting hole set 50. Dimension IL1 reflects the dimension between the closest surfaces of separate apertures 52 in a mounting hole set. Dimension IL2 reflects the dimension between one aperture and the point in the other aperture where the contoured side surface 60 transitions from a curved spline to the maximum aperture width AW2.

The apertures in a mounting hole set are preferably shaped to permit the enlarged ends 44 of an EMI clip 40 to pass through the aperture during installation, but also to retain the ends of the clip 40 once installed in the mounting hole set 50. Accordingly, the dimension AW2 is preferably larger than the width W2 of the enlarged ends 44 of the EMI clip, thereby permitting each end 44 of the EMI clip 40 to be inserted into each aperture 52 (see also FIGS. 5, 7, 8). The retaining method of the preferred embodiment also requires that the dimension AW1 be smaller than the width of the enlarged ends W2, but larger than the width W1 of the narrow center portion 42 of the EMI clip 40. In this application, it is desirable that the dimension AW1 be closer to width W1 than to width W2. Thus, once the EMI clip 40 is installed in a mounting hole set 50, the enlarged ends 44 are captively retained by the inner portions of the apertures 52. In addition, the spring forces of the obtuse 46 and acute 48 bends serve to prevent the enlarged ends 44 of the EMI clip 40 from exiting the apertures in the absence of externally applied removal forces.

Referring still to FIG. 6, dimension IL1 is roughly the same magnitude as installation dimension L shown in FIG. 3. The relationship between these dimensions is shown qualitatively in the profile section view at the center of FIG. 7. In practice, it may be desirable to provide a nominal interference between the clip and the mounting holes such that dimension L is slightly less than dimension IL1. This dimensioning scheme may provide an additional guarantee that the EMI clip 40 will be captively retained in the mounting hole set 50. However, it should be understood that the preferred mounting hole set may include a distance IL1 between apertures 52 that is smaller, equal to, or larger than dimension L.

Dimension IL2 defines the distance between one aperture and the point in the other aperture where the contoured side surface 60 transitions from a curved spline to the maximum aperture width AW2 (i.e., where the aperture width is at its largest). Because the apertures are mirror images of one another, a duplicate dimension can be drawn between the other corresponding set of points in the same mounting hole set. Hence, dimension IL2 is shown twice in FIG. 6.

During installation of the EMI clip 40, one enlarged end 44 of the clip is installed at a time. After a first enlarged end 44 has been installed in one aperture 52, the clip must be elastically stretched so that the second enlarged end 44 may be inserted in the second aperture 52 of the mounting hole set. Dimension IL2 defines the distance to which the EMI clip 40 must be stretched during such an installation. By their very nature, EMI clips 40 are configured to be elastically deformed when panels of an electronics enclosures are installed. However, it is also important that the clip maintain its shape so as to work properly. Thus, it is important that, during installation, the clip is not plastically or permanently deformed since this may affect the elastic deflection characteristics of the clip. Furthermore, a bent clip may be prone to coming loose or binding and creating interference between enclosure panels. It is therefore preferable that dimension IL2 be as large as possible, but not so large as to induce plastic deformation during installation of an EMI clip 40. Those skilled in the art will be able to assign a physical number to this dimension based on such factors as the thickness of the EMI clip, elasticity modulus for the clip material, and the heat treatment applied to the clip during manufacturing. All such variations are certainly intended to be within the scope of this description of the preferred embodiment.

Referring now to FIG. 7, top, profile, and bottom views of the preferred EMI clip 40 installed in the preferred mounting configuration are shown. Some of the pertinent dimensions heretofore discussed are duplicated in these views to further illustrate the relationship between the dimensions of the EMI clip 40 and those of the mounting hole set 50. As shown, and as discussed before, dimensions AW1 and AW2 are slightly larger than dimensions W1 and W2, respectively. For the captive features of the preferred embodiment to work property, clip dimension W2 must be larger than aperture dimension AW1. Similarly, dimensions L and IL1 are preferably about the same magnitude. With this dimensioning scheme, the EMI clip 40 is advantageously captively retained and should not fall out of its mounting configuration during normal use.

A further distinctive feature and characteristic of the preferred embodiment is the low profile nature of the clip. FIG. 8 shows section views of an assembled EMI clip in compressed and uncompressed contact with a mating cover. The upper view of FIG. 8 shows the uncompressed, relaxed state of the EMI clip 40 as a mating cover comes into contact with the clip. As the lower, compressed view shows, bend 46 in clip 40 deflects until the upper portion of the clip (portion between the mating surfaces) lies completely flat. Furthermore, the portion of the clip on the underside of the mounting surface lies substantially flat. The amount of actual protrusion on the bottom side of the mounting surface is determined only by the thickness of the clip and the bend radii in acute bends 48. If the bend radii are on the order of half the thickness of the mounting surface, then the compressed EMI clip will be substantially flush with the bottom side of the mounting surface. Thus, the preferred embodiment provides a fully captive, low-profile solution for mounting individual EMI clips 40.

One other design consideration deserves to be mentioned. The arrows in the upper view of FIG. 8 indicate the relative motion of portions of the clip that result as an upper cover comes into contact with the clip. As mentioned above, the obtuse bend 46 flattens as a downward compressive force is applied. As the upper portion of the clip deflects downward, the ends of the clip, including the enlarged ends that are on the underside of the mounting surface, deflect outwards. Hence, whereas the distance between the inner surfaces of bends 48 starts at a dimension L before compression, this distance increases to some larger dimension L2 after compression. This deflection must be taken into account when defining the mounting hole dimension IL2. It is important that mounting apertures 52 are positioned far enough from each other so that the EMI clip will not fall out of its mounting configuration. This design requirement must be met while considering of the limitations mentioned above that define the upper limit on the distance between the apertures. Together, these design requirements define the upper and lower distance limits between the apertures 52 to effectively provide a captive mounting scheme for the preferred EMI clip 40.

The above discussion is meant to be illustrative of the principles and various embodiments of the present invention. Numerous variations and modifications will become apparent to those skilled in the art once the above disclosure is fully appreciated. For example, while the preferred embodiment is described has having two enlarged ends that are insertable into a pair of mounting apertures, it is certainly feasible that an EMI clip can be designed with three or more enlarged ends that are each insertable into its own aperture. It is intended that the following claims be interpreted to embrace all such variations and modifications.

What is claimed is:

1. An EMI shielding device comprising:

an elastically deformable body portion capable of applying a contact force between a top compressing surface and a planar bottom mounting surface; and more than one enlarged, planar end portions that may each be installed in separate apertures in the mounting surface to captively retain the EMI shielding device on the mounting surface;

wherein when an installed EMI shielding device is compressed between the compressing and mounting surfaces, the deformable body portion of the EMI shielding device lies flat between the compressing and mounting surfaces and the enlarged end portions lie substantially flat on the side of the mounting surface opposite the side facing the compressing surface.

2. The EMI shielding device of claim 1 further comprising:

an obtuse bend at the top of the shielding device configured to bend elastically from some static angle larger than 90 degrees to an angle of 180;

flat planar surfaces on either side of the obtuse bend; and acute bends at the end of the planar surfaces opposite the obtuse bend;

wherein the enlarged end portions extend inward from the side of the acute bend opposite the planar surfaces.

3. The EMI shielding device of claim 2 comprising two enlarged, planar end portions.

4. The EMI shielding device of claim 2 wherein the radius of each acute bend is roughly equal to half the thickness of the mounting surface.

5. The EMI shielding device of claim 4 wherein:
the acute bends are also elastically deformable to permit compression of the EMI shielding device between the mounting and compressing surfaces and also to permit extension of the EMI shielding device during installation of the EMI shielding device onto the mounting surface.

6. The EMI shielding device of claim 5 further comprised of an electrically conductive material.

7. An EMI clip retaining system comprising:
a flexible EMI clip with a center portion that bows upwards and inwards from acute bends situated at the outer ends of the EMI clip and also comprising enlarged end portions that extend flatly inwards from the acute bends; and
a planar mounting surface with mounting holes through which the enlarged end portions of the EMI clip are inserted during installation of the EMI clip onto the mounting surface, such that once the EMI clip is installed, the enlarged ends of the EMI clip reside on a bottom side of the mounting surface while the center portion bows upward from the opposite, top side of the mounting surface;
wherein once the EMI clip is installed onto the mounting surface, the EMI clip is captively retained by the shape of the mounting holes and also by the elastic forces within the EMI clip; and
wherein if the center portion is compressed flat against the top side of the mounting surface, the EMI clip lies flat against both the top and bottom sides of the mounting surface.

8. The EMI clip retaining system of claim 7 wherein the mounting surface holes further comprise:
a single aperture corresponding to each enlarged end of the EMI clip;
wherein the aperture shapes are mirrored about an axis centered between the apertures.

9. An EMI clip retaining system comprising:
a flexible EMI clip with a center portion that bows upwards and inwards from acute bends situated at the outer ends of the EMI clip and also comprising enlarged end portions that extend flatly inwards from the acute bends; and
a planar mounting surface with mounting holes through which the enlarged end portions of the EMI clip are inserted during installation of the EMI clip onto the mounting surface, such that once the EMI clip is installed, the enlarged ends of the EMI clip reside on a bottom side of the mounting surface while the center portion bows upward from the opposite, top side of the mounting surface,
wherein once the EMI clip is installed onto the mounting surface, the EMI clip is captively retained by the shape of the mounting holes and also by the elastic forces within the EMI clip,
wherein if the center portion is compressed flat against the top side of the mounting surface, the EMI clip lies flat against both the top and bottom sides of the mounting surface, and
wherein the mounting surface holes further comprise:
a single aperture corresponding to each enlarged end of the EMI clip,
wherein the aperture shapes are mirrored about an axis centered between the apertures, and
wherein the mounting hole apertures further comprise:
a narrow inner width that is wider than the width of the center portion of the EMI clip but narrower than the width of the enlarged end portions of the EMI clip;
a wider outer width that is wider than the width of the enlarged end portions of the EMI clip; and
contoured sides that transition from the narrow inner width to the wider outer width,
wherein when the EMI clip is installed onto the mounting surface, the EMI clip is elastically stretched to insert the enlarged ends of the EMI clip through the wider outer width of the corresponding mounting hole apertures, and
wherein once the EMI clip is installed onto the mounting surface, the enlarged portions of the EMI clip contract to reside under the narrow inner width of the corresponding mounting hole apertures thereby captively retaining the EMI clip.

10. The EMI clip retaining system of claim 9 wherein:
the mounting hole apertures are positioned so that the narrow inner widths of the apertures are approximately the same distance apart as are the insides of the acute bends in the EMI clip; and
wherein the wider outer widths of the apertures are not so far as to induce plastic deformation of the EMI clip as it is stretched during installation.

11. The EMI clip retaining system of claim 10 wherein:
the mounting surface thickness is approximately twice the thickness of the radii of the acute bends in the EMI clip.

12. The EMI clip retaining system of claim 11 wherein each EMI clip comprises two enlarged ends.

13. An EMI clip retaining system comprising:
a flexible EMI clip with a narrow center portion and enlarged end portions; and
a planar mounting surface with mounting holes through which the enlarged end portions of the EMI clip are inserted such that the narrow center portion of the EMI clip reside on a top side of the mounting surface and the enlarged end portions of the EMI clip reside on the opposite, bottom side of the mounting surface;
wherein once the EMI clip is inserted onto the mounting surface, the EMI clip is captively retained by the shape of the mounting holes and also by the elastic forces within the EMI clip; and
wherein if the center portion is of the EMI clip compressed flat against the top side of the mounting surface, the EMI clip lies flat against both the top and bottom sides of the mounting surface.

14. The EMI clip retaining system of claim 13 wherein the narrow center portion of the flexible EMI clip further comprises:
acute bends situated at the outer ends of the EMI clip; and
a contact portion that bows upwards and inwards from the acute bends;
wherein the enlarged end portions extend flatly inwards from the acute bends.

15. The EMI clip retaining system of claim 14 wherein the mounting surface holes further comprise:
a single aperture corresponding to each enlarged end of the EMI clip;

wherein the aperture shapes are mirrored about an axis centered between the apertures.

16. An EMI clip retaining system comprising:

a flexible EMI clip with a narrow center portion and enlarged end portions; and a planar mounting surface with mounting holes through which the enlarged end portions of the EMI clip are inserted such that the narrow center portion of the EMI clip reside on a top side of the mounting surface and the enlarged end portions of the EMI clip reside on the opposite, bottom side of the mounting surface, wherein once the EMI clip is inserted onto the mounting surface, the EMI clip is captively retained by the shape of the mounting holes and also by the elastic forces within the EMI clip, wherein if the center portion is of the EMI clip compressed flat against the top side of the mounting surface, the EMI clip lies flat against both the top and bottom sides of the mounting surface, and wherein the narrow center portion of the flexible EMI clip further comprises:
  acute bends situated at the outer ends of the EMI clip; and
  a contact portion that bows upwards and inwards from the acute bends,
  wherein the enlarged end portions extend flatly inwards from the acute bends, and
wherein the mounting surface holes further comprise:
  a single aperture corresponding to each enlarged end of the EMI clip;
  wherein the aperture shapes are mirrored about an axis centered between the apertures, and
  wherein the mounting hole apertures further comprise:
    a narrow inner width that is wider than the width of the narrow center portion of the EMI clip but narrower than the width of the enlarged end portions of the EMI clip;
    a wider outer width that is wider than the width of the enlarged end portions of the EMI clip; and
    tapered sides that transition from the narrow inner width to the wider outer width,
    wherein when the EMI clip is installed onto the mounting surface, the EMI clip is elastically stretched to insert the enlarged ends of the EMI clip through the wider outer width of the corresponding mounting hole apertures, and
    wherein once the EMI clip is installed onto the mounting surface, the enlarged portions of the EMI clip contract to a position under the narrow inner width of the corresponding mounting hole apertures thereby captively retaining the EMI clip.

17. The EMI clip retaining system of claim 16 wherein:
the mounting hole apertures are positioned so that the narrow inner widths of the apertures are approximately the same distance apart as are the insides of the acute bends in the EMI clip; and
wherein the wider outer widths of the apertures are not so far as to induce plastic deformation of the EMI clip as it is stretched during installation.

18. The EMI clip retaining system of claim 16 wherein:
the mounting hole apertures are positioned so that the narrow inner widths of the apertures are a larger distance apart than the insides of the acute bends in the EMI clip so as to create an interference contact between the EMI clip and the mounting surface; and
wherein the wider outer widths of the apertures are not so far as to induce plastic deformation of the EMI clip as it is stretched during installation.

19. The EMI clip retaining system of claim 18 wherein:
the mounting surface thickness is approximately twice the thickness of the radii of the acute bends in the EMI clip.

20. The EMI clip retaining system of claim 19 wherein each EMI clip comprises two enlarged ends and two corresponding mounting hole apertures.

21. An EMI shielding device comprising:
an elastically deformable body portion capable of applying a contact force between a top compressing surface and a planar bottom mounting surface;
said body portion comprising an innermost portion having a first associated width and at least one enlarged outermost end portion having a second associated width, said end portion width being larger than said innermost portion width;
wherein one or more end portions are installable in separate apertures in the mounting surface to captively retain the EMI shielding device on the mounting surface;
wherein when an installed EMI shielding device is compressed between the compressing and mounting surfaces, the deformable body portion of the EMI shielding device lies flat between the compressing and mounting surfaces and the enlarged end portions lie substantially flat on the side of the mounting surface opposite the side facing the compressing surface.

22. The EMI shielding device of claim 21 further comprising:
an obtuse bend at the top of the shielding device configured to bend elastically from some static angle larger than 90 degrees to an angle of 180;
flat planar surfaces on either side of the obtuse bend; and
acute bends at the end of the planar surfaces opposite the obtuse bend;
wherein the enlarged end portions extend inward from the side of the acute bend opposite the planar surfaces.

23. The EMI shielding device of claim 22 comprising two enlarged, planar end portions.

24. The EMI shielding device of claim 22 wherein the radius of each acute bend is roughly equal to half the thickness of the mounting surface.

25. The EMI shielding device of claim 24 wherein:
the acute bends are also elastically deformable to permit compression of the EMI shielding device between the mounting and compressing surfaces and also to permit extension of the EMI shielding device during installation of the EMI shielding device onto the mounting surface.

26. The EMI shielding device of claim 25 wherein the elastically deformable body portion comprises an electrically conductive material.

* * * * *